(12) United States Patent
Li

(10) Patent No.: US 6,262,631 B1
(45) Date of Patent: Jul. 17, 2001

(54) SILICON POWER BIPOLAR JUNCTION TRANSISTOR WITH AN INTEGRATED LINEARIZER

(75) Inventor: Ping Li, Fox River Grove, IL (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/276,397

(22) Filed: Mar. 25, 1999

Related U.S. Application Data

(60) Provisional application No. 60/083,624, filed on Apr. 30, 1998.

(51) Int. Cl.[7] ............... H03F 1/26; H03F 3/04; H03F 1/30
(52) U.S. Cl. ........... 330/149; 330/305; 330/290; 375/297; 455/63
(58) Field of Search ................... 330/149, 302, 330/305, 43, 44, 290; 375/296, 297; 455/63

(56) References Cited

U.S. PATENT DOCUMENTS

| | | | |
|---|---|---|---|
| 5,361,042 | * 11/1994 | Gist | 330/290 |
| 5,710,523 | * 1/1998 | Kobayashi | 330/293 |
| 5,751,192 | * 5/1998 | Main | 330/110 |
| 5,789,978 | * 8/1998 | Zhang et al. | 330/149 |
| 5,915,213 | * 6/1999 | Iwatsuki et al. | 455/116 |
| 6,046,642 | * 4/2000 | Brayton et al. | 330/290 |

OTHER PUBLICATIONS

IEEE, 1997, pp. 45–48; A Low Distortion and High Efficiency HBT MMIC Power Amplifier with a Novel Linearizaton Technique for π/4 DQPSK Modulation; T. Yoshimasu, M. Akagi, N. Tanba and S. Hara; VLSI Development Laboratories, Tenri–IC Development Group, Sharp Corporation 2613– Ichinomoto–cho, Tenri–shi, Nara 632, Japan.

1997 IEEE MTT–S Digest; Development of A compact, Broadband FET Linearizer for Satelite Use. S. Ogura, K. Seino, T. Ono, A. Kamikokura and H. Hirose; Mitsubishi Esectric Corporation; pp. 1195–1198.

1995 IEEE MTT–S Digest; A Novel Amplitude and Phase Linearizing Technique for Microwave Power Amplifiers; pp. 1451–1454; M. Nakayama, K. Mori, K. Yamauchi, Y. Itoh, and T. Takagi.

1996 IEEE MTT–S Digest; pp. 831–834; A Novel Series Diode Linearizer for Mobile Radio Power Amplifiers; K. Yamauchi, K. Mori, M. Nakayma, Y Itoh, Y. Mitsui and O. Ishida.

* cited by examiner

*Primary Examiner*—Robert Pascal
*Assistant Examiner*—Patricia T. Nguyen
(74) *Attorney, Agent, or Firm*—Synnestvedt & Lechner LLP

(57) ABSTRACT

A power transistor with an integrated linearizer is provided in a package having only standard transistor terminals. The linearizer arranged between the base and collector of the transistor uses a Schottky diode as a nonlinear device that compensates for gain and phase deviations of the transistor. A collector voltage source that supplies power to the transistor provides bias to the diode. A DC blocking capacitor isolates an RF path between the input and output of the transistor from a diode biasing circuit to allow the collector voltage source to provide bias to the linearizer and the transistor separately. A tuning inductor is coupled in series with the DC blocking capacitor to offset the undesired phase rotation introduced by the capacitor. A DC biasing resistor is coupled between the diode and the collector of the transistor to set bias current supplied to the diode and isolate the collector voltage source from the RF path and ground.

20 Claims, 2 Drawing Sheets

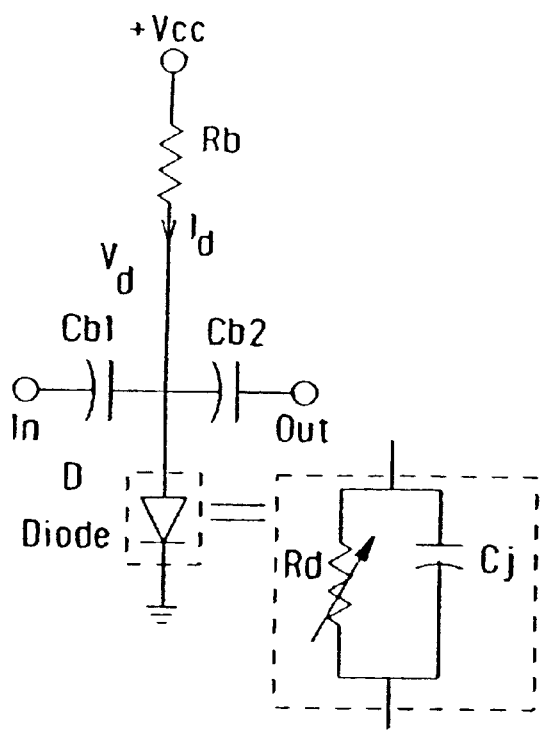
FIG.4
PRIOR ART
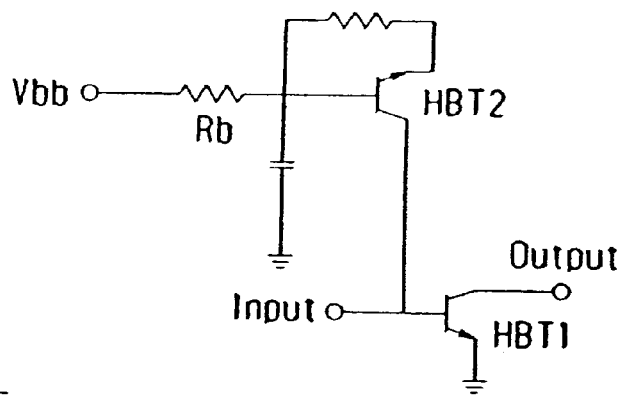
FIG. 5
PRIOR ART
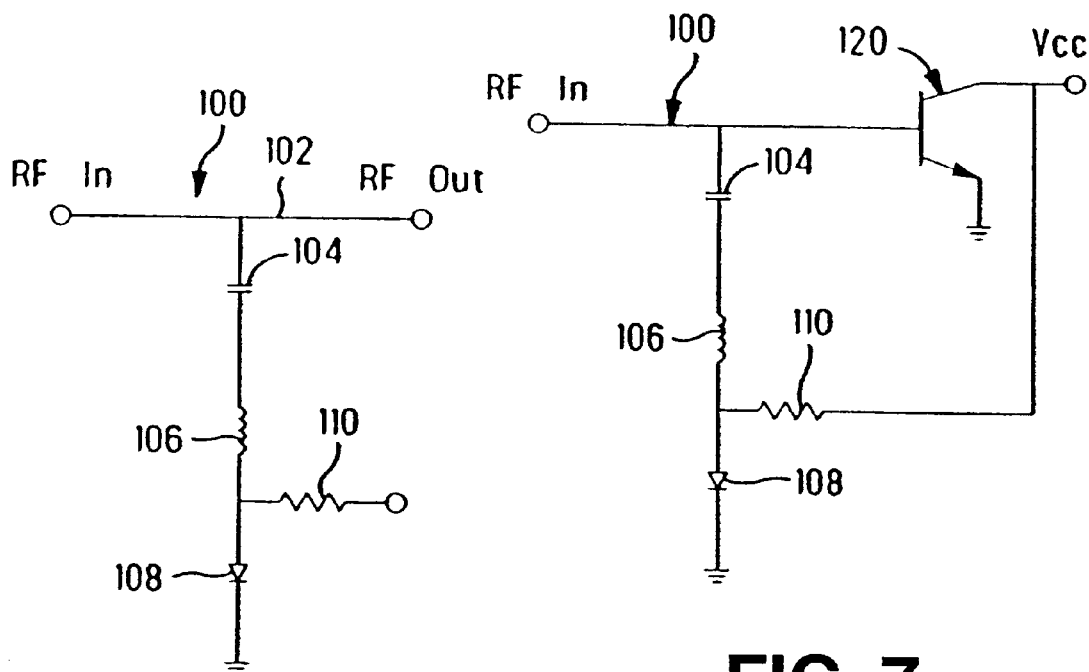
FIG. 6
FIG. 7

US 6,262,631 B1

SILICON POWER BIPOLAR JUNCTION TRANSISTOR WITH AN INTEGRATED LINEARIZER

RELATED APPLICATION

This patent application claims the benefit of priority based on U.S. Provisional Application No. 60/083,624 filed on Apr. 30, 1998, which is herein fully incorporated by reference.

FIELD OF THE INVENTION

The present invention relates to power amplifiers, and more particularly, to a linearizer that improves linearity of power transistors.

BACKGROUND OF THE INVENTION

Power amplifiers are key components of mobile and satellite communications systems. To increase efficiency of such systems, signals of multiple channels are amplified by a common power amplifier. Power amplifiers that operate outside of a small signal range are inherently nonlinear and thus introduce signal distortion when multiple signals are amplified. Moreover, to achieve high efficiency, power amplifiers in communications applications must operate near saturation levels. However, as amplitude and phase distortion drastically increase near a saturation region, highly efficient power amplifiers must be linearized for satisfactory operations.

Predistortion and feed-forward approaches have been used for linearizing power amplifiers. Feed-forward amplifier circuits typically employ a main amplifier which produces a fundamental power component and an unwanted distortion power component. A correction amplifier is used to produce only the distortion power component. An output combining circuit combines signals produced by the both amplifiers to cancel the distortion component. While a feed-forward linearizer performs satisfactorily for some transmitter systems, it is very expensive and requires critical alignment.

Predistortion is another technique for error correction in power amplifiers. In effect, the input signal to a power amplifier is predistorted with distortion components having phase and amplitude preselected so as to cancel distortion components introduced by the power amplifier. In a typical predistorion linearizer, the input signal is split into two paths: a direct path and a predistortion path. In the predistortion path, the input signal is conditioned to produce a predistortion signal which is combined with the signal produced in the direct path. The combined signal is applied to a main amplifier. If the amplitude and phase of the predistortion signal are properly selected, the output of the main amplifier will have a low level of distortion.

FIG. 1 illustrates a conventional microwave power amplifier used in a portable telephone system. Input circuitry of the power amplifier comprises an input high power isolator 2, a predistortion linearizer 4 provided to compensate for the distortion of the power amplifier, and a high power isolator 6 arranged at the output of the linearizer 4. Ferrite circulators are usually employed as high power isolators. An attenuator 8 is coupled to the output isolator 6 for adjusting an input power level. The attenuator 8 can be controlled to provide temperature compensation of the input signal. A main power amplifier 10 is connected to the output of the attenuator 8.

Referring to FIG. 2, the predistortion linearizer 4 comprises a series feedback amplifier that employs a common-source field-effect transistor (FET) with a large source inductance Ls. An input matching circuit 12 is arranged at the input of the series feedback amplifier, and an output matching circuit 14 is provided at its output.

Another known implementation of the predistortion linearizer 4 is illustrated in FIG. 3, which shows a series diode linearizer having a diode D connected in parallel with a capacitor Cp. Bias chokes Lb1 and Lb2 are arranged in a direct-current power supply circuit. Capacitors Cb1 and Cb2 are arranged at the input and output of the linearizer to provide direct-current (DC) blocking. The series diode linearizer causes positive amplitude and negative phase deviations when the input power increases to compensate for distortions introduced by a power amplifier.

A further example of a conventional predistortion linearizer 4 is presented in FIG. 4, which illustrates a parallel diode linearizer using nonlinear resistance characteristics of a diode in forward bias condition for providing compensation for distortions. The parallel diode linearizer comprises a diode D coupled in parallel with a circuit between the input and the output of the linearizer. The diode D can be represented by an equivalent variable resistance Rd and a junction capacitance Cj connected in parallel. A resistor Rb is coupled between the diode D and a voltage supply Vcc to provide direct-current bias. Capacitors Cb1 and Cb2 provide direct-current blocking at the input and output of the linearizer.

As discussed above, in a conventional power amplifier illustrated in FIGS. 1–4, a predistortion linearizer requires high power isolators at its input and output. Therefore, it cannot be integrated with the main power amplifier to reduce the size of the amplification system.

FIG. 5 illustrates another example of a conventional linearizer for a power transistor amplifier. The linearizer comprises a forward biased base-collector diode HBT2, which together with a resistor Rb forms a base biasing circuit for a power transistor HBT1 used to amplify a radio frequency (RF) signal. A separate bias terminal Vbb is provided in addition to input and output terminals of the power amplifier to provide DC bias.

As the input power supplied to the base of the transistor HBT1 increases, the rectified DC current of the base-collector diode HBT1 increases and the DC voltage across the diode decreases. As a result, the DC voltage across the base-emitter diode HBT2 increases. The increased DC current drives the transistor HBT1 stronger, reducing the gain compression and phase distortion of the power amplifier. Since the DC voltage across the base-collector diode HBT2 decreases with the increase of the input power, the differential conductance of the diode decreases.

As the base-emitter conductance of the transistor HBT1 increases with the increase of the input power, the base-collector diode HBT2 compensates for variations of the HBT1 base-emitter conductance under large signal conditions, and reduces the phase distortion.

As discussed above, the linearizer shown in FIG. 5 requires a separate bias voltage terminal Vbb in addition to regular terminals used for a power transistor. Therefore, this linearizer cannot be integrated into a standard power transistor package.

However, to provide compatibility with other elements of a communications system, it would be desirable to create a linearizer that would be "invisible" to system elements coupled to a power transistor, and therefore, could be integrated into a standard power transistor package.

Also, it would be desirable to create a power transistor package containing a linearizer and having no additional terminals compared to standard transistor packages.

DISCLOSURE OF THE INVENTION

Accordingly, one object of the present invention is to provide a linearizer that can be integrated into a standard power transistor package.

Another object of the present invention is to provide a power transistor package comprising a linearizer and having no additional terminals compared to standard transistor packages.

These and other objectives of the invention are achieved at least in part by providing a linearizer having an input terminal for supplying a radio-frequency (RF) input signal, a nonlinear device for providing compensation for gain and phase deviations of a power transistor to be linearized, a DC biasing circuit coupled to a bias voltage terminal for providing bias to the nonlinear device, a DC blocking capacitor coupled between the input terminal and the nonlinear device for isolating an RF signal path from the DC biasing circuit.

In accordance with a preferred embodiment of the invention, the DC biasing circuit comprises a resistor coupled between the bias voltage terminal and the nonlinear device for setting bias current supplied to the nonlinear device. In addition, a tuning inductor can be coupled to the DC blocking capacitor for offsetting phase rotation introduced by the DC blocking capacitor. The nonlinear device can comprise a diode coupled between the DC blocking capacitor and a ground terminal.

For example, the input terminal can be connected to the base terminal of the power transistor, the bias voltage terminal can be coupled to the collector terminal of the power transistor, and the ground terminal can be connected to the emitter terminal of the power transistor.

In accordance with another aspect of the present invention, a transistor package having no more than three terminals is provided. It contains a transistor element supplied with power from a voltage source and having input, output and ground terminals. A linearizer integrated with the transistor element is coupled to the input, output and ground terminals and has a biasing circuit supplied from the voltage source.

In accordance with a preferred embodiment of the transistor package, the linearizer comprises a nonlinear device for providing compensation for gain and phase deviations of the transistor element, a DC blocking capacitor coupled between the input terminal and the biasing circuit supplied from the voltage source via the output terminal to provide bias to the nonlinear device, an inductor coupled to the DC blocking capacitor to offset undesired phase rotation introduced by the DC blocking capacitor. The biasing circuit may comprise a resistor coupled between the output terminal and the nonlinear device.

For example, a Schottky diode coupled to the ground terminal may be used as the nonlinear device. The transistor element can be a bipolar junction transistor having a base connected to the input terminal, a collector connected to the output terminal, and a emitter connected to the ground terminal.

In accordance with a further aspect of the invention, the linearizer is suitable for integration with a transistor in a transistor package having no more than three terminals.

Still other aspects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIGS. 2–5 are diagrams illustrating conventional linearizers for a power amplifier.

FIG. 6 is a circuit disgram of a linearizer of the present invention.

FIG. 7 is a circuit diagram of a silicon power transistor with an integrated linearizer of the present invention.

BEST MODE FOR CARRYING OUT THE INVENTION

Figure 1:
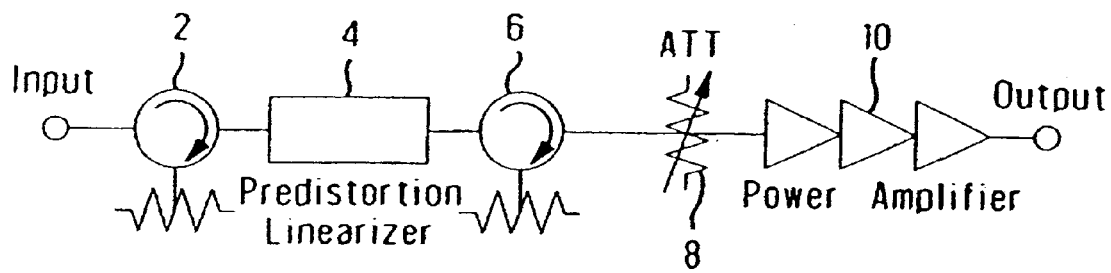
FIG. 1 is a block diagram of a conventional linearized amplifier.
Figure 2:
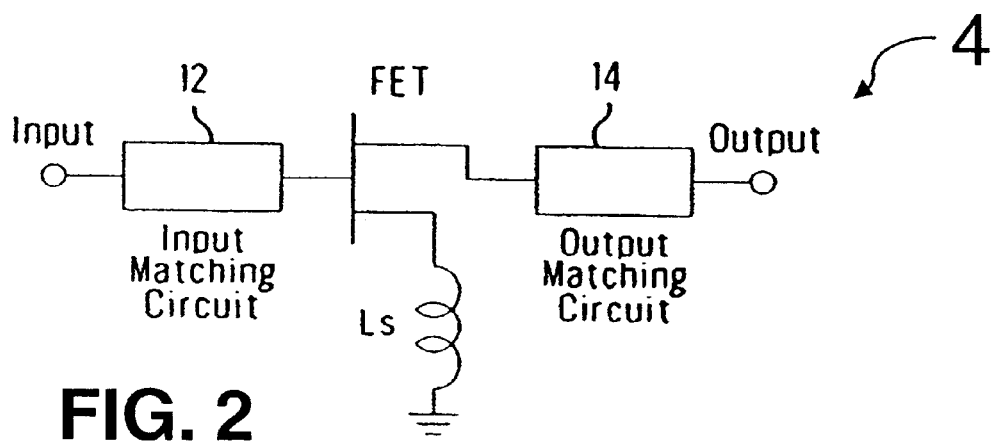
Figure 3:
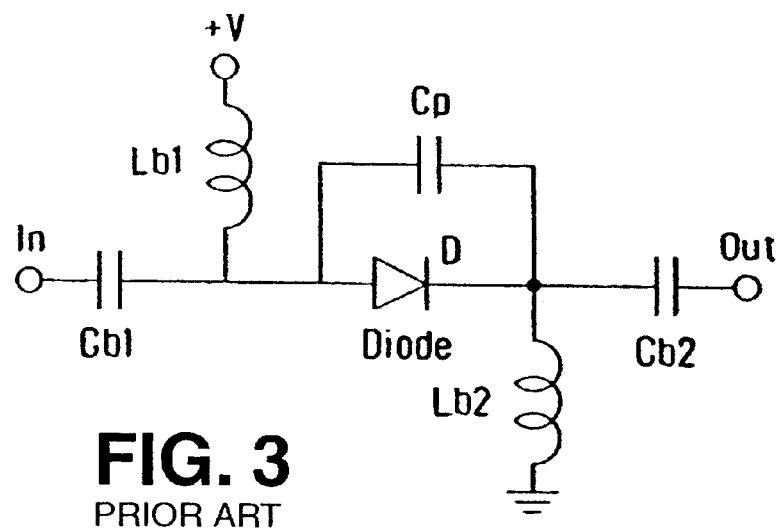

Although the invention has general applicability in the field of signal processing, the best mode for practicing the invention is based in part on the realization of a linearizer suitable for integration with a power transistor.

Referring to FIG. 6, a linearizer 100 of the present invention comprises a radio frequency (RF) path 102 provided between an RF input and an RF output, a series LC circuit composed of a direct-current (DC) blocking capacitor 104 and a tuning inductor 106 is connected to the RF path 102, a diode 108 coupled between the inductor 106 and a ground terminal, a resistor 110 connected between a direct-current voltage source Vcc and the diode 108 to provide bias to the diode 108.

The DC blocking capacitor 104 is coupled to the RF circuit of a power transistor so as to isolate the DC biasing circuit from the RF circuit. Thus, the linearizer 100 and the power transistor can be biased separately.

The capacitor 104 is selected in the range between about 30 pF and 40 pF.

The tuning inductor 106 is coupled in series with the capacitor 104 to offset the undesired phase rotation introduced by the capacitor 104. As a result, the phase compensation of the linearizer 100 can be controlled. The tuning inductor 106 is selected in the range between about 0.5 nH and 1 nH.

The DC bias resistor 110 sets a bias current for biasing the diode 108. The value of the resistor 110 should be high enough to isolate the DC voltage source Vcc from the RF path 102 and from the ground terminal. For example, the resistor 110 can be selected in the range between about 1 kOhm and 5 kOhm.

The diode 108 having the anode connected to the resistor 110 and the cathode coupled to the ground terminal is used as a nonlinear device for providing gain and phase compensation required to compensate for gain and phase deviations of the power transistor. The diode 108 is biased by the DC voltage Vcc supplied via the resistor 110. For example, a Schottky diode can be used as the diode 108.

In accordance with the present invention, a linearizer integrated with a power transistor is "invisible" to system elements coupled to the power transistor. For example, FIG. 7 shows the linearizer 100 integrated into a standard package of a silicon bipolar junction transistor 120 having base, collector and emitter terminals. An input RF signal is supplied to the base terminal of the transistor 120. The amplified output power signal is produced at the collector terminal provided with collector voltage Vcc. The emitter terminal is grounded.

The linearizer 100 is arranged between the base and the collector of the transistor 120. The DC blocking capacitor 104 is connected to the base, the resistor 110 is coupled to the collector, and the diode 108 is arranged between the resistor 110 and ground. The tuning inductor 106 is connected in series with the capacitor 104 to offset the undesired phase rotation introduced by the capacitor 104.

The nonlinear resistance of the diode 108 is used to compensate for gain and phase variations of the power amplifier 120. When the power supplied to the RF input increases, the resistance of the diode 108 also increases. As a result, the power loss on the diode 108 is reduced, thereby increasing the gain of the power amplifier. Thus, the gain compression of the transistor 120 is reduced.

The base-emitter conductance of the transistor 120 increases with the increase of the input power. Since the conductance of the diode 108 is reduced when the input power increases, the diode 108 compensates for variations in the phase response of the transistor 120. Therefore, the phase distortion of the power amplifier is reduced. The gain and phase compensation can be controlled by adjusting values of linearizer circuit elements.

As the DC bias resistor 110 is connected between the Vcc voltage source and the diode 108, the collector voltage Vcc is used to provide bias to the diode 108. Thus, an additional bias power supply is not required.

As the linearizer 100 is arranged in parallel with respect to the transistor 120, no DC blocking occurs between the input and the output of the transistor 120. The DC blocking capacitor 104 isolates the diode biasing circuit from the RF path between the input and the output of the transistor 120. Accordingly, the linearizer 100 and the transistor 120 are biased separately using the same bias voltage source Vcc. The value of the resistor 110 is selected large enough to isolate the Vcc voltage source from the RF path and from the ground. Thus, the linearizer 100 can be produced directly on a substrate of an existing power transistor.

As the linearizer 100 operates using only the base, collector and emitter terminals of the power transistor, the linearizer 100 can be integrated into a standard bipolar transistor package. By contrast with the conventional linearizer illustrated in FIG. 5, only regular base, emitter and collector connections are required to interface such a transistor package with other power amplifier elements. No separate bias voltage source is needed. The power transistor package with an integrated linearizer of the present invention does not need a separate bias voltage source such as the Vbb source used in the conventional linearizer illustrated in FIG. 5. As described herein, in accordance with the present invention, a regular transistor's power supply source is used to produce bias voltage for the linearizer.

Although the present invention is described with the example of a silicon bipolar junction transistor with integrated linearizer, it is not intended that the invention be limited thereto. In another variation, the linearizer of the present invention can be integrated with a laterally double diffused MOS transistor.

There accordingly has been described a linearizer suitable for integration with a transistor into a package having only standard transistor terminals. The linearizer arranged between the base and collector of the transistor uses a Schottky diode as a nonlinear device that compensate for gain and phase deviations of the transistor. A collector voltage source that supplies power to the transistor provides bias to the diode. A DC blocking capacitor isolates an RF path between the input and output of the transistor from a diode biasing circuit to allow the collector voltage source to bias up the linearizer and the transistor separately. A tuning inductor is coupled in series with the DC blocking capacitor to offset the undesired phase rotation introduced by the capacitor. A DC biasing resistor is coupled between the diode and the collector of the transistor to set bias current supplied to the diode and isolate the collector voltage source from the RF path and ground.

In this disclosure, there are shown and described only the preferred embodiments of the invention, but it is to be understood that the invention is capable of changes and modifications within the scope of the inventive concept as expressed herein.

What is claimed is:

1. A transistor package having no more than three terminals, the transistor package comprising:
   a transistor element having input, output and ground terminals; and
   a linearizer coupled to the input, output and ground terminals of the transistor element and having a biasing circuit supplied with biasing power from the output terminal of the transistor element.

2. The transistor package of claim 1, wherein the linearizer comprises a nonlinear device for providing compensation for gain and phase deviations of the transistor element.

3. The transistor package of claim 2, wherein the linearizer further comprises a DC blocking capacitor coupled between the input terminal and the biasing circuit.

4. The transistor package of claim 3, wherein the linearizer further comprises an inductor coupled to the DC blocking capacitor to offset undesired phase rotation introduced by the DC blocking capacitor.

5. The transistor package of claim 4, wherein the biasing circuit comprises a resistor coupled between the output terminal and the nonlinear device.

6. The transistor package of claim 5, wherein the nonlinear device comprises a diode coupled to the ground terminal.

7. The transistor package of claim 6, wherein the transistor element is a bipolar junction transistor having base connected to the input terminal, collector connected to the output terminal, and emitter connected to the ground terminal.

8. A linearizer suitable for integration with a transistor in a transistor package having no more than three terminals, the linearizer comprising:
   a nonlinear device for compensating for parameter deviations of the transistor,
   a biasing circuit supplied via a power supply terminal of the transistor package for providing bias current supplied to the nonlinear device, and
   a DC blocking capacitor coupled between an input terminal of the transistor package and the nonlinear device for preventing the biasing current from being supplied to a signal input of the transistor.

9. The linearizer of claim 8, wherein the biasing circuit comprises a resistor coupled between the power supply terminal and the nonlinear device.

10. The linearizer of claim 8, further comprising a tuning inductor coupled in series with the DC blocking capacitor for offsetting undesired phase rotation introduced by the DC blocking capacitor.

11. The transistor package of claim 1, wherein the output terminal of the transistor element is directly coupled to a voltage source for supplying power to the transistor element.

12. The transistor package of claim 11, wherein the voltage source supplies the biasing power to the biasing circuit through the output terminal of the transistor element.

13. The transistor package of claim 1, wherein the linearizer further includes a DC (direct current) blocking element coupled between the biasing circuit and the input terminal of the transistor element.

14. The transistor package of claim 13, wherein the linearizer further includes a compensation element coupled to the DC blocking element for compensating undesired phase rotation introduced by the DC blocking element.

15. The transistor package of claim 13, wherein the DC blocking element is a capacitor.

16. The transistor package of claim 14, wherein the compensation element is an inductor.

17. A transistor package having no more than three terminals, the transistor package comprising:

a transistor element supplied with power from a voltage source and including input, output and ground terminals; and a linearizer coupled to the input, output and ground terminals and including a biasing circuit supplied with power from the voltage source, wherein the linearizer includes a nonlinear device for providing compensation for gain and phase deviations of the transistor element, the biasing circuit is supplied with power from the voltage source via the output terminal to provide bias to the nonlinear device, and the linearizer further includes a DC (direct current) blocking capacitor coupled between the input terminal and the biasing circuit, and an inductor coupled to the DC blocking capacitor to offset undesired phase rotation introduced by the DC blocking capacitor.

18. The transistor package of claim 17, wherein the biasing circuit comprises a resistor coupled between the output terminal and the nonlinear device.

19. The transistor package of claim 17, wherein the nonlinear device comprises a diode coupled to the ground terminal.

20. The transistor package of claim 17, wherein the transistor element is a bipolar junction transistor having a base connected to the input terminal, a collector connected to the output terminal, and an emitter connected to the ground terminal.

* * * * *